(12) United States Patent
Cheng

(10) Patent No.: US 6,210,746 B1
(45) Date of Patent: Apr. 3, 2001

(54) METHOD OF FABRICATING A SOLDER RESIST MASK

(75) Inventor: David C. H. Cheng, Taoyuan Hsien (TW)

(73) Assignee: Unimicron Taiwan Corp., Taipei (TW)

( * ) Notice: Subject to any disclaimer, the term of this patent is extended or adjusted under 35 U.S.C. 154(b) by 0 days.

(21) Appl. No.: 09/321,665

(22) Filed: May 28, 1999

(51) Int. Cl.$^7$ ........................................ B05D 5/12
(52) U.S. Cl. ............................ 427/96; 174/251
(58) Field of Search ............... 438/617; 430/312; 228/180; 174/251, 250

(56) References Cited

U.S. PATENT DOCUMENTS

| | | | |
|---|---|---|---|
| 4,289,575 | * | 9/1981 | Matsumoto et al. . |
| 4,506,004 | * | 3/1985 | Sullivan . |
| 4,994,349 | * | 2/1991 | Blumenstock et al. . |
| 5,112,440 | * | 5/1992 | Banks et al. . |
| 5,288,589 | * | 2/1994 | McKeever et al. . |
| 5,400,948 | * | 3/1995 | Sajja et al. . |
| 5,464,662 | * | 11/1995 | Murakami et al. . |
| 5,641,608 | * | 6/1997 | Grunwald et al. . |
| 5,843,621 | * | 12/1998 | Scafer . |

FOREIGN PATENT DOCUMENTS

| | | | |
|---|---|---|---|
| 196 19 292 A1 | * | 11/1997 | (DE) . |
| 63-001544 | * | 1/1988 | (JP) . |

* cited by examiner

*Primary Examiner*—Tuan H. Nguyen
*Assistant Examiner*—Evan Pert
(74) *Attorney, Agent, or Firm*—Jiawei Huang; J C Patents

(57) ABSTRACT

A method for fabricating a solder mask. A substrate having wires is provided, and bonding pads are positioned on the wires for coupling with other devices. A first solder resist layer is formed over the substrate to cover the wires and the substrate. A precure process is performed. A portion of the first solder resist layer is removed to expose the wires, and then the residual first solder resist layer is cured. A second solder resist layer is formed to cover the residual first solder resist layer and the wires. After precuring, a portion of the second solder resist layer is removed to expose the bonding pads.

25 Claims, 2 Drawing Sheets

METHOD OF FABRICATING A SOLDER RESIST MASK

BACKGROUND OF THE INVENTION

1. Field of the Invention

The present invention relates to a method for fabricating a solder mask. More particularly, the present invention relates to a method for fabricating a solder mask by performing two printing steps.

2. Description of the Related Art

In the conventional method for fabricating a solder mask, a solder resist layer is formed on a printed circuit board. Then, a portion of the solder resist layer covering a region of bonding pads is totally removed; thus, no solder mask is formed between the bonding pads. This may cause a short between the bonding pads. Furthermore, an electroplating layer is usually formed on the bonding pads for coupling with other devices, and the shorts easily occur due to an absence of solder mask formation between the bonding pads. When the pitch is narrower than 8 mil or 0.2 mm, the short thus more easily occurs. As a result, the reliability and the yield of the printed circuit board are both reduced.

SUMMARY OF THE INVENTION

The present invention provides a method for fabricating a solder mask. By the method, the solder mask is formed by performing two printing steps; thus, unwanted electrical connection is avoided. Furthermore, the reliability and the yield of the substrate are both increased.

The invention provides a method for fabricating a solder mask. A substrate having wires with bonding pads for coupling with other devices is provided. A first solder resist layer is formed over the substrate to cover the wires and the substrate. A precure process is performed. A portion of the first solder resist layer is removed to expose the wires, and then the residual first solder resist layer is cured. A second solder resist layer is formed to cover the residual first solder resist layer and the wires. After precuring, a portion of the second solder resist layer is removed to expose the bonding pads.

In the invention, the solder mask is formed by performing two printing steps. By the solder mask, the unwanted electrical connection is avoided. As a result, the reliability and the yield of the printed circuit board are both increased. Additionally, it is easy to form the electroplating layer for coupling with other devices because only the bonding pads are exposed.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
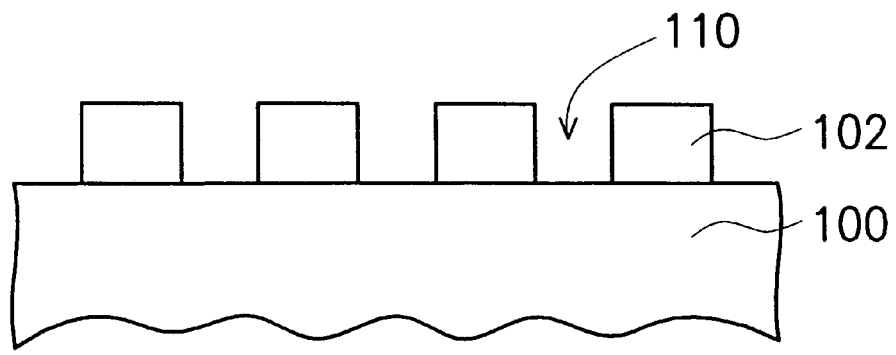
FIGS. 1 through 5 are schematic, cross-sectional diagrams of a method for fabricating a solder mask according to the invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1 through 5 are schematic, cross-sectional diagrams of a method for fabricating a solder mask according to the invention. FIG. 6 is a schematic, top view of a solder mask fabricated according to the invention.

Referring to FIG. 1, a substrate 100 such as printed circuit board or chip carrier is provided. The substrate 100 is formed by a prepreg such as FR-4 or BT (Bismaleimide-Triazine) resin. Wires 102 are formed on the substrate 100, and trenches 110 are between the wires 102. The wires 102 include copper or other conducting materials. Additionally, bonding pads 102a (FIG. 6) for coupling with other devices are formed on or from the wires 102.

In FIG. 1, the wires 102 are formed on the substrate 100. This configuration is merely used to describe this invention, and the invention is not restricted by this configuration. Other configurations are also suitable for the invention.

Figure 2:
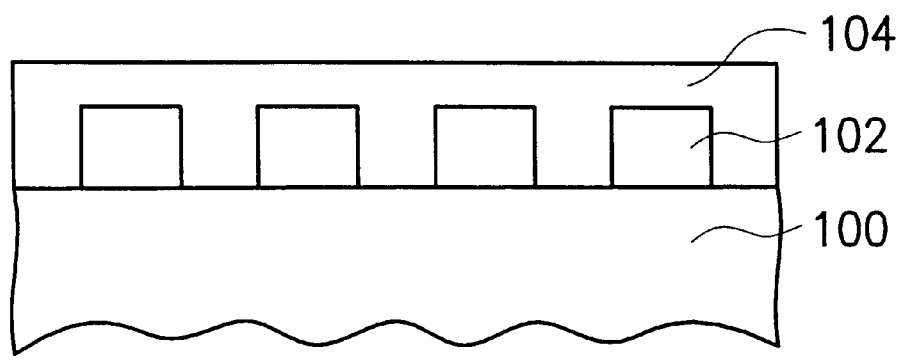

Referring to FIG. 2, a solder resist layer 104 is formed to cover the wires 102 and fills the trenches 110. The solder resist layer 104 includes insulation materials such as UV-type solder resist. The step of forming the solder resist layer 104 includes roller coating, curtain coating, screen printing, or dipping. Then, a precure process is performed to remove solvents in the solder resist layer 104. Adhesion between the solder resist layer 104 and the substrate 100 can be improved by the precure process.

Figure 3:
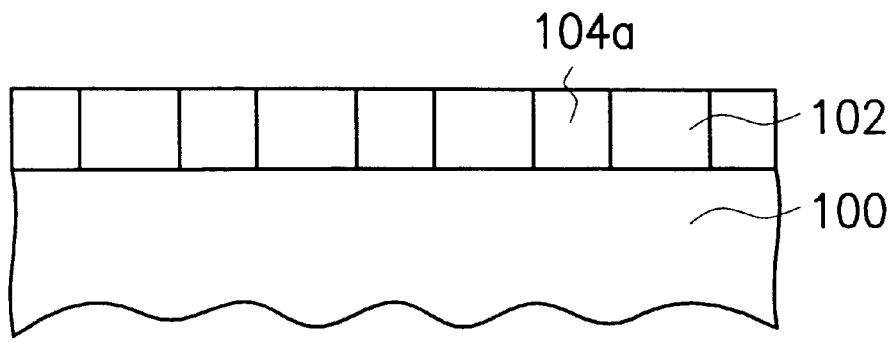

Referring to FIG. 3, a portion of the solder resist layer 104 is removed to expose the wires 102, and a lower solder mask 104a is formed within the trenches 110 (FIG. 1) to isolate the wires 102. The lower solder mask 104a is approximately as thick as the wires 102. The step of removing a portion of the solder resist layer 104 includes mechanical polishing. For example, when the solder resist layer 104 (FIG. 2) is made from a UV-type solder resist, a chemical polishing in a developer is used to remove a portion of the solder resist layer 104, and the lower solder mask 104a is formed. Then, the lower solder mask 104a is cured by UV light.

Figure 4:
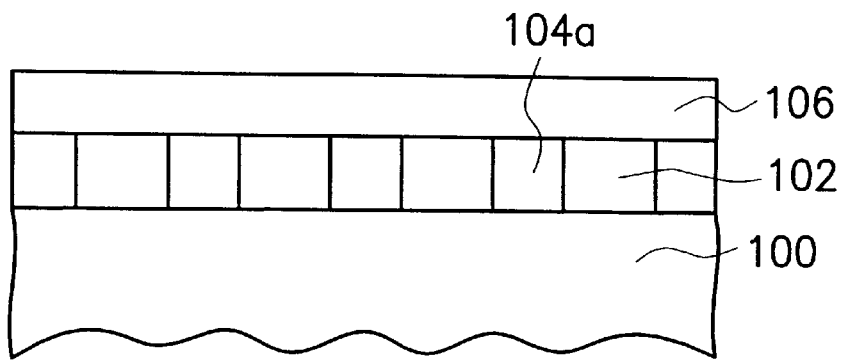

Referring to FIG. 4, a solder resist layer 106 is formed to cover the wires 102 and the lower solder mask 104a. The material of the solder resist layer 106 and the step of forming the solder resist layer 106 are both similar to those of the solder resist layer 104, so that detailed description is omitted. Then, a precure process is performed to remove solvents in the solder resist layer 106. Adhesion between the solder resist layer 106 and other layers can be improved by the precure process.

Figure 5:
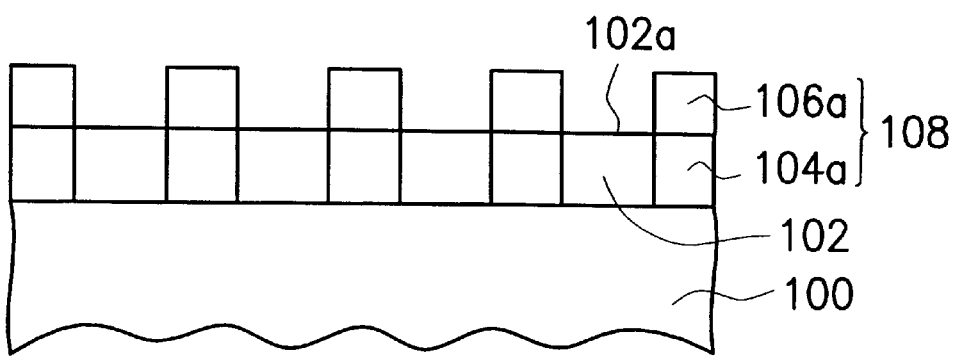
Figure 6:
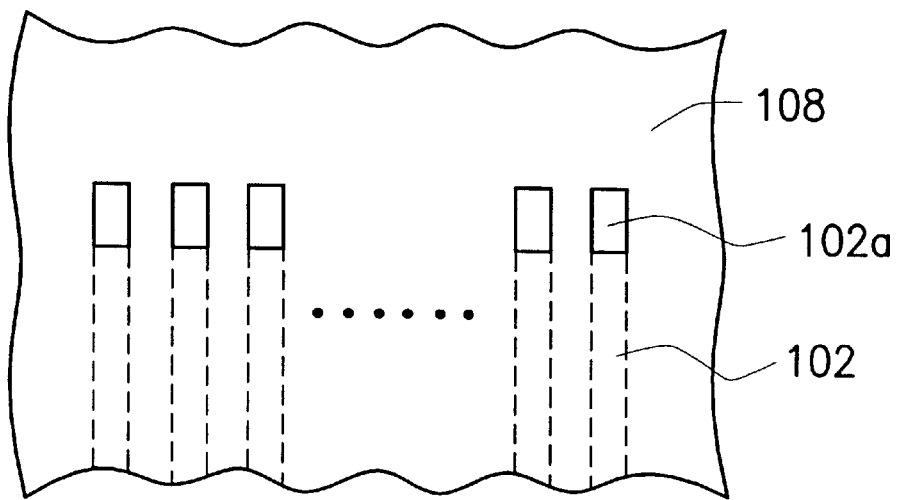
FIG. 6 is a schematic, top view of a solder mask fabricated according to the invention.

Referring to FIG. 5 and FIG. 6, the solder resist layer 106 is irradiated by UV light. The pattern of the wires 102 and the bonding pads 102a is therefore transferred onto the solder resist layer 106; i.e. the solder resist layer 106 is patterned. A portion of the solder resist layer 106 is removed, and then an upper solder mask 106a is formed. The upper solder mask 106a exposes the bonding pads 102a. A solder mask 108 is made from the lower solder mask 104a and the upper solder mask 106a. An electroplating layer (not shown) is then formed on the bonding pads 102a for coupling with other devices. The material of the electroplating layer includes gold, nickel, or other conducting materials.

Referring to FIG. 6, a portion of the wires 102 indicated by dashed lines is covered by the solder mask 108, and the bonding pads 102a are exposed for coupling with other devices. After the solder mask 108 is formed, the cross-sectional diagram of the bonding pad region is like FIG. 5, and the cross-sectional diagram of the other region is like FIG. 4.

In the invention, the solder mask made from the lower solder mask and the upper solder mask is formed by performing two printing steps. The lower solder mask is first formed between the wires, and then the upper solder mask is formed on the wires and exposes the bonding pads. By the solder mask, the unwanted electrical connection between the bonding pads is avoided. As a result, the reliability and the yield of the printed circuit board are both increased. Additionally, it is easy to form the electroplating layer for coupling with other devices because only the bonding pads are exposed.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a solder mask, comprising the steps of:

providing a substrate;

forming a plurality of wires with bonding pads thereon over the substrate:

forming a first solder resist layer to cover the wires and the substrate;

removing a portion of the first solder resist layer to expose the wires, wherein a residual first solder resist layer is level with the bonding pads;

forming a second solder resist layer to cover the wires and the residual first solder resist layer; and removing a portion of the second solder resist layer to expose the bonding pads.

2. The method of claim 1, wherein the step of forming the first solder resist layer includes roller coating.

3. The method of claim 1, wherein the step of forming the first solder resist layer includes curtain coating.

4. The method of claim 1, wherein the step of forming the first solder resist layer includes screen printing.

5. The method of claim 1, wherein the step of forming the first solder resist layer includes dipping.

6. The method of claim 1, wherein the step of removing a portion of the first solder resist layer includes mechanical polishing.

7. The method of claim 1, wherein the first solder resist layer includes UV-type solder resist.

8. The method of claim 7, wherein a precure process is performed before removing a portion of the first solder resist layer.

9. The method of claim 7, wherein the step of removing a portion of the first solder resist layer includes a developer.

10. The method of claim 7, wherein the first solder resist layer is irradiated by UV light before the second solder resist layer is formed.

11. The method of claim 1, wherein the step of forming the second solder resist layer includes roller coating.

12. The method of claim 1, wherein the step of forming the second solder resist layer includes curtain coating.

13. The method of claim 1, wherein the step of forming the second solder resist layer includes screen printing.

14. The method of claim 1, wherein the step of forming the second solder resist layer includes dipping.

15. The method of claim 1, wherein the second solder resist layer includes an UV-type solder resist.

16. The method of claim 15, wherein after the second solder resist layer is formed, further comprises the steps of:

precuring the second solder resist layer; and using UV light to irradiate the second solder resist layer.

17. The method of claim 15, wherein the step of removing a portion of the second solder resist layer includes a developer.

18. A method for fabricating a solder mask, comprising the steps of:

forming a plurality of wires having bonding pads thereon over a substrate:

forming a lower solder mask between the wires to be level with the bonding pads; and forming an upper solder mask to cover the wires and the lower solder mask, wherein the bonding pads are exposed.

19. The method of claim 18, wherein the step of forming the lower solder mask comprises:

forming a first solder resist layer to cover the wires and the substrate; and removing a portion of the first solder resist layer to expose the wires.

20. The method of claim 19, wherein the step of removing a portion of the first solder resist layer includes mechanical polishing.

21. The method of claim 19, wherein the first solder resist layer includes UV-type solder resist.

22. The method of claim 18, wherein the step of removing a portion of the first solder resist layer includes a developer.

23. The method of claim 18, wherein the step of forming the upper solder mask comprises:

forming a second solder resist layer to cover the wires and the lower solder mask; and removing a portion of the second solder resist layer to expose the bonding pads.

24. The method of claim 23, wherein the second solder resist layer includes UV-type solder resist.

25. The method of claim 24, wherein the step of removing a portion of the second solder resist layer comprises:

patterning the second solder resist layer by UV light; and removing a portion of the second solder resist layer by a developer.

* * * * *